United States Patent [19]

Fenical

[11] Patent Number: 5,294,270
[45] Date of Patent: Mar. 15, 1994

[54] HEAT-TREATED WIRE-MESH EMI/RFI SHIELDING GASKET

[75] Inventor: Gary Fenical, East Stroudsburg, Pa.

[73] Assignee: Instrument Specialties Company, Inc., Delaware Water Gap, Pa.

[21] Appl. No.: 932,549

[22] Filed: Aug. 20, 1992

Related U.S. Application Data

[62] Division of Ser. No. 657,842, Feb. 20, 1991, abandoned.

[51] Int. Cl.⁵ .............................................. C21D 9/52
[52] U.S. Cl. ................................ 148/576; 148/568; 148/679; 148/595
[58] Field of Search ............... 148/679, 432, 568, 576, 148/595, 908

[56] References Cited

U.S. PATENT DOCUMENTS

| Re. 33,256 | 7/1990 | Busby | 174/35 GC |
|---|---|---|---|
| 2,519,850 | 8/1950 | Pierson, Jr. | 174/35 |
| 2,674,644 | 4/1954 | Goodloe | 174/35 |
| 2,755,079 | 7/1956 | York et al. | 267/1 |
| 3,026,367 | 3/1962 | Hartwell | 174/35 |
| 3,413,406 | 11/1968 | Plummer | 174/3 |
| 4,065,138 | 12/1977 | Severinsen | 277/230 |
| 4,514,585 | 4/1985 | Paynton | 174/35 GC |
| 4,551,185 | 11/1985 | Loesch | 148/568 |
| 4,705,580 | 11/1987 | Yamazaki | 148/568 |
| 4,710,590 | 12/1987 | Ekdahl | 174/35 GC |
| 4,731,500 | 3/1988 | Otsuka | 174/36 |
| 4,791,236 | 12/1988 | Klein et al. | 174/36 |
| 4,979,280 | 12/1990 | Weil | 29/446 |

OTHER PUBLICATIONS

Primec Corporation, Designers Guide 10A, "Primec Twinshield+Strips and Gaskets", (no date available).
A. D. Merriman, A Dictionary of Metallurgy 1964, p. 9 and 352.

*Primary Examiner*—Deborah Yee
*Attorney, Agent, or Firm*—Burns, Doane, Swecker & Mathis

[57] ABSTRACT

A wire-mesh gasket fashioned from heat-treatable materials such as beryllium copper alloy wire is knitted or braided into a tubular structure. Plural wires may be used. Various cross-sectional configurations such as circular, teardrop, double lobed, and finned with and without cores are available. Cores may be air, elastomeric, or wire mesh. The formed tubular structure is heat-treated after forming using appropriate time-temperature cycles to strengthen and/or stress relieve the material.

17 Claims, 3 Drawing Sheets

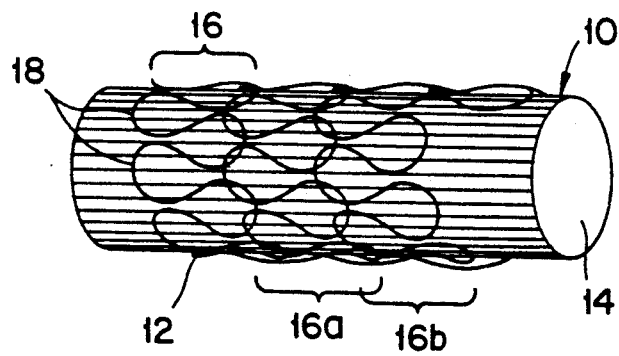
Fig. 1
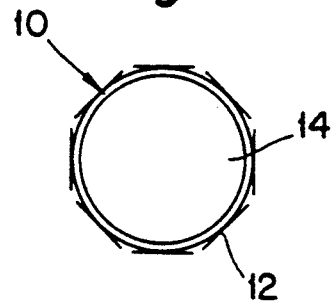
Fig. 2
Fig. 3
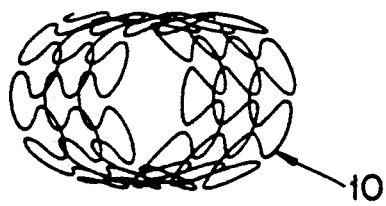
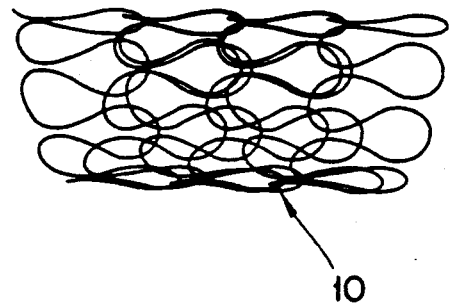
Fig. 4
Fig. 5
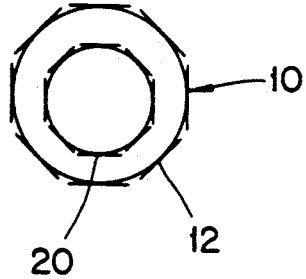
Fig. 6
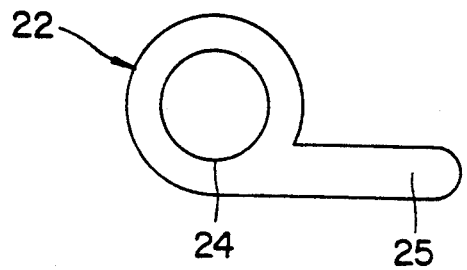

HEAT-TREATED WIRE-MESH EMI/RFI SHIELDING GASKET

This application is a divisional, of application Ser. No. 07/657,842, filed Feb. 20, 1991, now abandoned.

BACKGROUND OF THE INVENTION

The present invention relates generally to EMI/RFI shielding devices. More specifically, the invention relates to a particular EMI/RFI shielding gasket and the method of making such a gasket.

Various types of EMI/RFI gaskets are known for reducing the transmission of electromagnetic interference (EMI) and radio frequency interference (RFI). Among the known devices are gaskets having a resilient core surrounded by a deformable wire-mesh gasket material. Such gaskets are compressed around access openings and the like by the mating surfaces of a shielded housing.

Known wire-mesh gaskets are made from soft materials so that they do not break during manufacture. However, those known gaskets deflect in response to lateral pressure but do not have sufficient resiliency to restore their shape to its undeflected condition. Thus, a resilient core is relied upon to partially expand the gasket when lateral pressure is released so that the gasket can be reused. The resilient core may not fully relieve the compression set of the wire mesh because the core may also have compression set. This situation is particularly true in cyclic loading conditions. Such wire-mesh gasket materials may have a variety of cross-sectional shapes such round, rectangular, double cores, and round having a fin. Suitable known materials are tin-plated phosphor bronze, tin-coated copper-clad steel, silver-plated brass, monel, and aluminum. A variety of such wire-mesh gaskets are made by Tecknit EMI Shielding Products. Different core cross sections and materials are used for different applications.

Other types of gaskets are also known which are fashioned from heat-treated beryllium copper. Such gaskets typically include similarly shaped elements sequentially arranged, e.g., longitudinally along a strip. Heat-treated beryllium copper is used because of its resilience and due to its excellent electrical conductivity. Heat-treated or cold-worked beryllium copper has limited elongation and is subject to breakage when subjected to small radius bends associated with knitting and braiding processes. Accordingly, beryllium copper has not been suitable for use in knitted and braided applications like those used for wire-mesh gasket construction.

SUMMARY OF THE INVENTION

In one aspect the present invention deals with a wire-mesh gasket fashioned from a heat-treatable material knitted or braided into a tubular shape and having a core. The core may be air. A preferred wire material is heat-treated beryllium copper.

To enhance the EMI shielding characteristics, the gasket may have one or more knitted wire-mesh inner layers. Alternatively, or in combination with multiple layers, the gasket ma use multiple wires that are simultaneously knitted.

Cross sections for the heat-treatable wire-mesh gasket may be circular, teardrop-shaped, or double lobed. To increase the conductor density of the gasket, inner mesh layers can be provided.

In another aspect, the invention concerns a method of making a wire-mesh gasket. A ductile heat-treatable wire, such as solution annealed beryllium copper, is formed into a tubular shape by braiding or knitting. The formed wire is partially work-hardened in localized regions as a consequence of that shaping. Next, the tubular member is heat treated to harden it, which may include precipitation hardening. That heat treatment also increases the yield strength of the material at the same time internal stresses are relieved.

When the application of the wire-mesh gasket requires longitudinal dimensional stability, the forming step preferably comprises a braiding operation. More particularly, plural wires of the heat-treatable material are braided such that individual wires tend to helically define the longitudinal tubular member.

For those applications where the wire-mesh gasket must be highly pliant, the forming step preferably comprises a knitting operation. In the knitting operation, a single wire of the heat-treatable material is helically knitted into a tubular member with loops being longitudinally intertwined.

To provide additional contact force or to support the structure when it is bent around corners, a resilient core can be used. Elastomers are suitable materials for such cores. Where the resilient core will not degrade at heat treatment conditions, the tubular member can be braided or knitted around the core. For resilient core materials that are subject to degradation at heat-treatment conditions, the core can be inserted after the tubular structure has been heat-treated.

Where higher conductor density is required for the wire-mesh gasket, smaller diameter heat-treatable wire-mesh members can provide the cores around which the tubular member is knitted or braided.

The resulting wire-mesh gasket has considerably enhanced resiliency and greatly reduced compression set when compared to known wire-mesh products.

BRIEF DESCRIPTION OF THE DRAWINGS

Many objects and advantages of the present invention will be apparent to those skilled in the art when this specification is read in conjunction with the drawings wherein like reference numerals have been applied to like elements and wherein:

FIG. 1 is a perspective view of a wire-mesh gasket according to the present invention with a core;

FIG. 2 is an end view of the wire-mesh gasket of FIG. 1;

FIG. 3 is a perspective view of a wire-mesh gasket having an air core;

FIG. 4 is a side elevation of the wire-mesh gasket of FIG. 3;

FIG. 5 is a cross-sectional view of a wire-mesh gasket having a wire-mesh core;

FIG. 6 is cross-sectional view of a wire-mesh gasket having a laterally offset, integral fin;

DETAILED DESCRIPTION OF THE PREFERRED EMBODIMENTS

Figure 7:
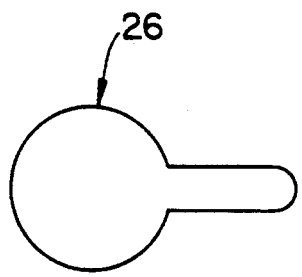
FIG. 7 is a cross-sectional view of a wire-mesh gasket having a centrally disposed, integral fin.

A wire-mesh gasket 10 (see FIG. 1) has an elongated tubular member 12 that envelops a core 14. While the tubular member 12 is illustrated as being circularly cylindrical in cross section; however, oval, elliptical, and polygonal cross-sectional shapes including square, rectangular, hexagonal and the like are also contemplated. The core 14 can be selected from any one of a variety of materials. When a solid core is desired, the core 14 is preferably a circularly cylindrical element of an elastomeric material. In appropriate applications, the core 14 could even be hollow.

For applications where the wire-mesh gasket 10 should have both longitudinal and transverse compliance, the tubular member 12 may be formed by a suitable conventional knitting process. In a knitted process, a wire is sinuously or serpentinely looped or bent into a band 16 that is helically formed so that adjacent portions 16a, 16b of the band overlap one another. In that overlapping area, wire loops 18 of one section of the band interengage wire loops of the adjacent longitudinally displaced section of the band. This process results in a structure that has a substantial length in comparison to its transverse characteristic dimension, the diameter.

With that helically knitted arrangement, longitudinal compliance is provided for the wire-mesh gasket 10 since interengaged loops 18 of the wire are substantially free to slide longitudinally with respect to one another and with respect to loops of adjacent portions 16a, 16b. Furthermore, lateral or radial compliance is also provided since the serpentine loops 18 have little torsional resistance and are only constrained at the four spaced points where adjacent loops are engaged. As a result, when subjected to transverse force loads, the wire-mesh gasket 10 readily undergoes deflection. With heat-treated material the deformation is substantially elastic. With prior materials like mill-hard monel and stainless steel, plastic deformation occurs more readily.

The knitted mesh 12 is preferably fabricated from a material having high electrical conductivity and substantial resiliency. High electrical conductivity is particularly desirable in EMI/RFI gaskets. Substantial resiliency is an important characteristic for gaskets of this invention as resiliency in the wire makes possible elimination of a resilient core. A preferred material for the gasket 10 is a metal such as beryllium copper alloy wire which can be heat treated to increase its resiliency while reducing localized work hardening. Other preferred materials include spinodal alloys (copper-nickel-tin) as well as precipitation hardening steel alloys. Generally speaking, wire with a diameter in the range of 0.001 to 0.015 inches is suitable, while a diameter of about 0.006 inches is preferred. The heat-treatable metal wire can be plated as appropriate to assure galvanic compatibility in the ultimate application.

While precise dimensions of the wire-mesh gasket can be varied, generally speaking the gasket has a substantial length in relation to its transverse dimension or diameter. It has been found that a diameter of about 3/16 inch is suitable for many applications. For a gasket 10 of that size, nine circumferentially positioned loops of about 0.1 inch length are suitable. For larger diameter gaskets, the size and length of the loops remains approximately the same, but the number of loops in each circumferential ring increases. Conversely, for smaller diameter gaskets, the number of loops in each circumferential ring decreases.

Ordinarily the core 14 is generally cylindrical. As seen in FIG. 2, the core may have a circular cross section. Depending upon the application, the core can have one or more longitudinal holes running through it. Moreover, the core can be annular. Any suitable material can be used for the core. As seen in FIG. 3, the core can even be air. Or, as seen in FIG. 1, the core 14 may be fashioned from a solid material. As used in herein, "solid" core material includes elastomers, foamed elastomers, composite materials, conductive polymers, polymers containing conductive inclusions, and the like.

In the preferred embodiment (see FIG. 4), the gasket 10 has an air core. Moreover, the gasket 10 is fashioned from a heat-treatable metal such as beryllium copper that is heat treated to a suitable hardness after being formed. The knitted configuration of the gasket 10 with an air core is the same as the configuration described above in connection with the elastomeric core; however, the elevation of FIG. 4 shows that the shape appears to be much more complicated While the elastomeric core 14 of FIG. 1 can provide additional resiliency to the wire-mesh gasket 10, such additional resiliency can also be provided by a core comprising another knitted wire-mesh layer 20 (see FIG. 5) of smaller diameter. The resulting structure is layered, the knitted core layer 20 being one layer and the outer wire-mesh gasket 12 being a second layer. For applications where a higher density of conductors is desired, additional concentric knitted wire-mesh layers may be used. In most applications the various layers will be made from the same heat-treatable material, beryllium copper in this instance. It is, however, within the purview of this invention to make each of the layers from a different material, a different construction method, and/or from different wire diameters of the same material.

Another alternative contemplated here is the use of multiple wires during the knitting process. For example two or three wires could be simultaneously knit to form a tubular structure. Presence of multiple wires would increase both the number of conductors and the size of the contact area.

The cross section of the gasket 10 may be selected as desired. For example, the wire-mesh gasket may have a teardrop shape in cross section and may include a core 24 as well. The gasket 22 may have an integral, laterally offset fin 25 (see FIG. 6). As desired, a core 24 may also be provided. The fin 25 is made by pinching or flattening one side of the tubular cross section. While a sharp corner is illustrated in the figure, the corner may be generously filletted to accommodate manufacturing conveniences.

The conventional tube with a centrally disposed fin configuration 26 is also possible (see FIG. 7). Here again, sharp corners may be filletted as desired. Another possible cross section configuration is a pair of parallel tubes within the wire-mesh gasket 30 (see FIG. 8). The gasket may be connected between the tubes 32, 34 so that the shape is a pair of connected lobes. In the latter embodiment, opposed portions of the gasket 30 are pressed or pinched together between the tubes 32, 34 and then connected by stapling, stitching, riveting, or the like. Sharp bends or corners in the tubular shape can be generously filletted as desired. Each of these cross-sectional configurations may have an air core, or a solid core. Furthermore, solid cores may have any of the configurations discussed in this specification.

As will be appreciated by those skilled in the art, the circumferentially and longitudinally interengaged loops of the knitted wire-mesh gasket are compliant when subjected to either lateral or longitudinal forces. Thus, the knitted wire-mesh gasket is an excellent choice for applications where the longitudinal as well as lateral compliance are desired.

Figure 9:
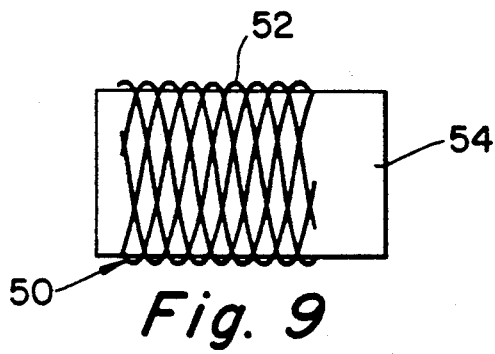
FIG. 9 is a side elevation of a braided wire-mesh gasket according to the present invention.

However, for those applications where lateral compliance is desired but longitudinal compliance is not desired, another embodiment of the wire-mesh gasket is preferred. Specifically, a braided mesh arrangement (see FIG. 9) meets these performance parameters. In the braided gasket 50, a suitable heat-treatable wire 52 is braided or woven into a tubular structure. The wire 52 may be selected from the same materials discussed above in connection with the knitted gasket discussion. A core 54 may be provided, if desired. Here again, the core 54 may be selected from the same materials previously discussed. Moreover, the core 54 may be air since the beryllium copper is sufficiently resilient that a solid core is not required.

The interwoven wires 52 of the braided embodiment wrap the core 54 in an essentially helical manner. When the wires 52 are subjected to longitudinal tensile forces, there is very little compliance. Rather, longitudinal forces tend to axially extend the helical wires 52, which accommodate such forces by reducing the diameter of the helix. The presence of a solid core 54 resists that force response. Accordingly, the braided wire-mesh gasket 50 is not compliant in response to longitudinal tensile forces unless fastened to prevent axial movement.

When subjected to lateral forces, however, the braided wire-mesh gasket 50 is compliant, although not as compliant as the knitted gasket. Lateral forces are accommodated by deflection of the gasket 50 in a transverse plane, i.e., the generally circular cross section deflects to become oval. While a similar effect occurs with the knitted embodiment, the serpentine helical pattern of the knitted embodiment is much less stiff than the individual substantially helical wires 52 of the braided gasket 50. Thus, the braided gasket 50 is less compliant than the knitted gasket.

Theoretically speaking, an EMI/RFI gasket with the very best performance would be a continuous conductor having perfect contact with both opposing surfaces that are being sealed. In the real world, however, contact with opposing surfaces is not perfect. In addition, substantial bending stresses in the gasket materials can lead to cracks and other mechanical failures. Thus, the wire-mesh gasket is a compromise. It will be immediately understood from either FIG. 4 or FIG. 9 that articulated structures of wire-mesh gaskets have openings therethrough. Where a shielding device has openings, the EMI/RFI shielding effectiveness is frequency dependent. At high frequencies, those openings can, themselves, become leakage points for electromagnetic radiation. Additionally at high frequencies, self-inductance of the wire-mesh structure increases the impedance across the gasketed joint. The result is a mismatch in electrical potential between the two enclosure surfaces which produces a radiated field. Accordingly, wire-mesh gaskets of the type described in this specification are suitable for use where the electromagnetic frequency being shielded lies in the range below 18 gigahertz.

Figure 10:
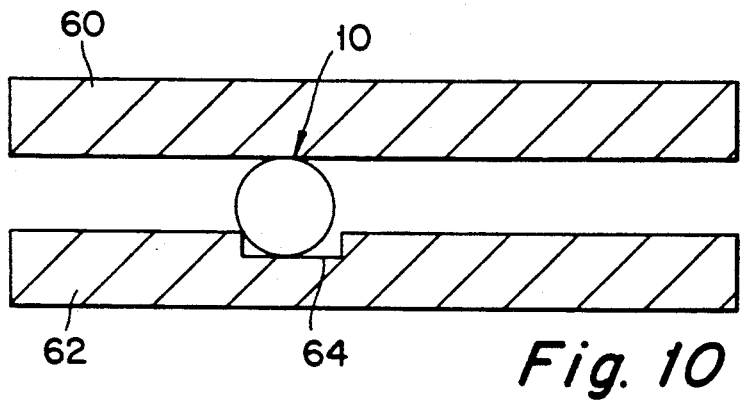
FIG. 10 is a cross-sectional view of a wire-mesh gasket having an air core in use.

In use, a wire-mesh gasket according to this invention is typically positioned between generally planar members 60, 62 (see FIG. 10). Those planar members frequently comprise the surface around an opening and a cover or hatch for that opening. If desired, one or both of the members 60, 62 may have a groove 64 within which the gasket 10 is positioned. Such a groove 64 may have a width larger than the width of the gasket 10 at that depth so that the gasket is free to deflect when the planar members are closed against one another and secured by a catch, screws, or any other suitable conventional connecting device.

Regardless of the connecting device, the gasket 10 is at least partially deflected at each radial cross section. That deflection, coupled with resiliency of the wire forming the gasket, ensures mechanical and electrical contact between the wire of the gasket and the surface of the adjacent member 60, 62.

Figure 11:
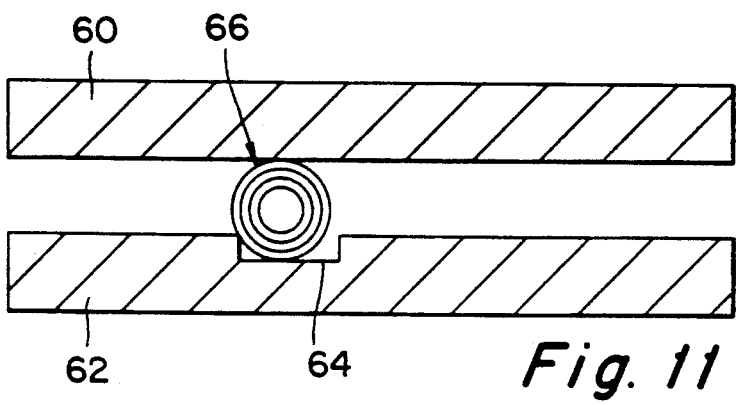
FIG. 11 is a cross-sectional view of a wire-mesh gasket having a wire-mesh core in use.

In some applications, it will be desirable to have a larger density of electrical conductors touching the opposed planar surfaces 60, 62 (see FIG. 11). For such applications, the gasket 66 may have a plurality of nested, generally concentric layers. Each layer may be knitted or braided, as desired.

Figure 12:
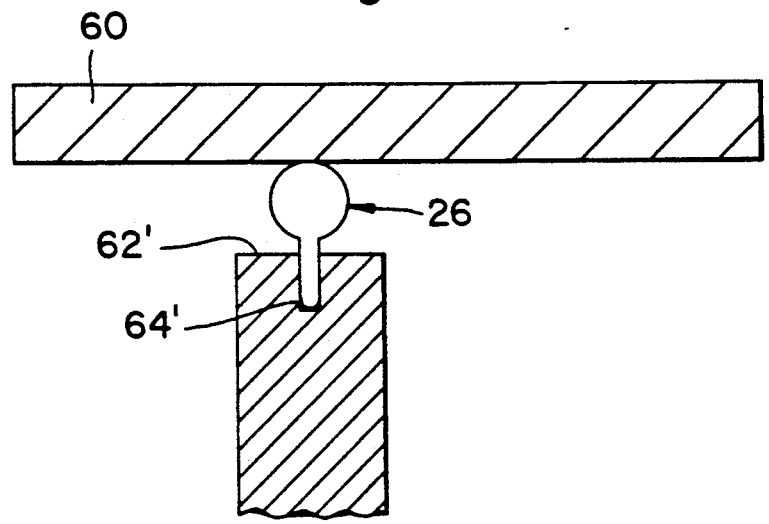
FIG. 12 is a cross-sectional view of a wire-mesh gasket in use having a centrally disposed fin in use.

For other applications, it may be preferred to secure the gasket 26 in a closely conforming groove. To this end, one of the opposed planar surfaces 62' (see FIG. 12) has a groove 64' which conforms to the external contour of the gasket 10. As illustrated, the gasket with a centrally disposed fin is well suited for applications where a panel door, e.g., 60, closes against the edge of another member.

Turning now to the method of making a wire-mesh gasket according to the present invention, a suitable heat-treatable material in wire form having a predetermined temper is selected. A preferred heat-treatable material is beryllium copper alloy wire. The selected material is preferably solution annealed and in a ductile or unhardened condition.

The selected wire is formed into a tubular shape. That tubular shape is accomplished either by knitting or by braiding. Where the ultimate application requires a gasket that has both lateral and longitudinal compliance, the knitting process is preferred. On the other hand, where the ultimate application requires a gasket having longitudinal stiffness, the braiding process is preferred.

The density of a knit structure is limited by how small a loop can be made in the wire. The size of the loop is approximated by the following relationship:

$$R_M = \frac{D}{2\epsilon_F} \quad [1]$$

where $R_M$ is the mean radius of the loop, D is the wire diameter, and $\epsilon_F$ is the strain at failure. For convenience, "elongation" as used herein is a reference to the strain at failure. Heat-treatable materials have large elongations, and can therefore be bent to a smaller radius. For example, the elongation for solution annealed beryllium copper is 40% (0.400) whereas the elongation for hardened beryllium copper is 2% (0.020). From equation [1], it follows that for wires of the same diameter annealed beryllium copper can be formed in loops that are 0.05 the size of loops in hardened beryllium copper. Since density is proportional to the minimum size of wire loops which can be formed, the density of a knit structure formed with annealed material can be on the order of 20 times the density of a knit structure formed with hardened material.

During the shape forming process, whether knitting or braiding is used the selected material is subjected to localized work-hardening, thereby mechanically enhancing yield strength of the selected material at that location.

The tubularly shaped form is then heat treated to further enhance its yield strength by subjecting the material to a predetermined time-temperature cycle. Where beryllium copper alloy is used that heat treatment is accomplished by heating the tubularly shaped form to a temperature in the range of 550° F. to 900° F. for a time period in the range of 0.10 to 24 hours. Preferably, the heat treatment is accomplished at a temperature in the range of 550° to 700° F. for a time period in the range of 0.25 to 24 hours. And most preferably the heat treatment is performed at a temperature of 550° to 650° F. for a time period in the range of 2–3 hours. The shorter time periods are selected for the higher temperatures and the longer time periods are selected for the lower temperatures. That heat treatment can raise the temper condition of the wire-mesh material as high as the full hard state when dealing with beryllium copper.

During heat treatment, beryllium copper experiences precipitation hardening thereby increasing yield strength while reducing internal stresses. That combination of characteristics allows the wire-mesh gasket to be laterally compressed further than unhardened wire mesh before permanent deformation occurs. Furthermore, such a result is not possible with the previously used wire-mesh gasket materials since those conventional materials cannot be fully hardened before knitting as such full hardening would cause cracking during the knitting process. Moreover, additional stresses from lateral compression during use would cause the weak, already-stressed material to crack or permanently deform. Thus, the post-fabrication heat-treatment process allows greater deflection of the wire-mesh gasket in response to lateral forces since the heat-treated beryllium copper is both stronger and less internally stressed than conventional materials.

The use of heat-treatable conductive material to manufacture braided, or knitted EMI/RFI shielding gaskets has some unique advantages over the use of a non-heat-treatable material for this purpose. During the manufacturing process, the heat-treatable materials such as alloy CDA-17200 (beryllium copper) has a low yield strength and very high elongation. Those characteristics permit smaller bend radii to be used in the manufacturing process which, in turn, allows a finer mesh. The finer mesh increases the shielding ability of the gasket, especially at higher frequencies, by restricting the flow of electromagnetic radiation through the mesh openings and also by increasing the surface area.

A second advantage of using heat-treatable materials is their ability to be stress relieved in the heat-treatment cycle. In the usual application of EMI/RFI shielding gaskets, the gasket is compressed, and due to this compression the bends in the knit are further bent, inducing even higher strains. When using non-heat-treatable materials much of the strain to failure of the material is used in forming the knitted structure. The amount of strain remaining after the material is formed is limited and this in turn limits the amount of deflection the gasket can endure before the wire cracks, or breaks. By heat treating the material after forming, the material is stress relieved, and can tolerate much higher strains before failure, while maintaining the same or higher strength levels than the non-heat-treatable material. A major problem with knitted gaskets is breakage in which free slivers of broken wire fall into electronic enclosures causing shorts. Heat treating after the forming step thus reduces such problems.

For applications where a larger number of conductors is needed, the forming step may be repeated such that an additional tubular shape having larger cross-sectional dimensions envelops the first tubular shape. Third and fourth layers can be formed in similar fashion, as desired. In this instance, the additional tubular shapes are formed before the heat-treatment step. Alternatively, two or more wires can be simultaneously knitted into one tubular shape.

In the event it is desired to further include an elastomeric core, the step of forming a tubular shape is performed around the core.

Given that the wire of the gasket is heat treated after its formation into a tubular member, the elastomeric core should be selected from a material that is stable and can withstand heat-treatment conditions of time and temperature. If the selected elastomeric material is not capable of withstanding those conditions, then the elastomeric material can be inserted into the tubular member after the heat-treatment process.

To tailor the gasket for certain applications, one side of the tubular knitted shape can be creased so that the element has a teardrop shape in cross section (see FIG. 6). The creasing step is performed prior to the heat-treating step.

Figure 8:
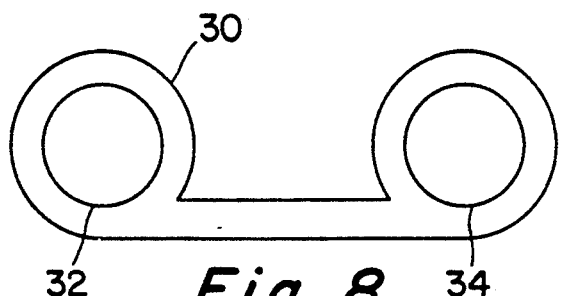
FIG. 8 is a cross-sectional view of a wire-mesh gasket having a pair of parallel cores and a double lobe shape.

In another alternative, the wire-mesh is knitted around a pair of elastomeric cores (see FIG. 8). After the tubular shape is attained, the cores are laterally displaced from one another and the knitted tubular structure is flattened between them. The flattened structure is secured by stapling, wire stitching, riveting, or the like such that the cross section has a double-lobed or double teardrop shape. Generous fillets can be provided between the lobes, as desired.

Where the wire-mesh gasket is provided with an elastomeric core, that core may be selected from an elastomer that is stable and capable of withstanding the heat-treatment temperatures without significant degradation. Specialty grade silicone and fluorosilicone based elastomers have the high temperature characteristics suitable for use with this invention.

By creating a wire-mesh gasket in accord with the foregoing process, internal stresses in the wire caused by the knitting or braiding process are relieved during the heat treatment. Further, the heat treatment increases the yield strength and hardness of the material to a value that could not otherwise be used in the knitting and braiding processes without breakage.

These points can be considered in the context of material strength and material formability. As can be seen from equation [1], the formula for bend radius set forth above, when the wire diameter is the same and the bending radius is the same for the materials being compared, the strain $\epsilon$ will be the same for both materials. Strain in any material is limited by the stain at failure, or elongation, $\epsilon_F$, which is a published value. Bending the wire more tightly causes crack formation. A fair comparison of material strength, therefore, can be made where the heat-treatable material has an elongation ≧ the elongation of non-heat-treated material.

In the case of beryllium copper, H temper heat treatable material has an elongation of 2-8% while AT hardened material has an elongation of 3-8%. Tensile strength for heat treated H materials is 185-225 KSI while tensile strength for AT materials is only 165-190 KSI. Thus the yield strength increase for a mesh according to this invention is 12-18%.

Turning to formability, equation [1] set forth above demonstrates that the bend radius is inversely proportional to the elongation, $\epsilon_F$. Quarter-hard heat-treated beryllium copper (¼ HT) and mill-hard beryllium copper (XHMS) have equal tensile strengths. However, quarter-hard has an elongation of 10-26% while mill-hard has an elongation of 3-9%. Since actual elongation values tend to lie in the middle of those ranges, comparing the corresponding endpoints of the ranges gives a fair indication of the advantage attained:

$$\frac{R_{M\frac{1}{4}XT}}{R_{MXHMS}} = \frac{\epsilon_{FXHMS}}{\epsilon_{F\frac{1}{4}XT}} = \frac{1}{3.33-4.0}$$

Accordingly it can be seen that the heat-treatable material can be formed with loops about ¼ the size of a comparable non-heat-treatable material, resulting in a fourfold increase in knitted loop density.

Heat treatment of the formed wire-mesh gasket has the further advantage that the soft temper heat-treatable alloy wire can be formed into intricate shapes without cracking. This result is possible since the heat-treatable alloys are highly ductile in the solution annealed condition. Furthermore, the high ductility of the soft temper wire allows tighter bends to be used than were heretofore known since the high ductility is associated with low spring back characteristics. Tighter bends result in a higher density knitted structure than would otherwise be anticipated.

The resulting gasket has a higher yield strength than could otherwise be attained. Moreover, to date, no gasket has been made from heat treatable alloys which have the characteristics described above.

There are of course a variety of applications where gaskets according to this invention will be used to encircle rectangular openings or openings which have corners. As the foregoing discussion will demonstrate, once heat treated, the structures of this invention are less tolerant of elongation. To accommodate that consideration, a gasket 80 according to the present invention (FIG. 13) may be preformed to the final configuration before heat treating. For example, the gasket 80 is provided with a right angle bend. The sharpness of the bend can be accommodated while the wire-mesh material is in a ductile condition. After preforming, the gasket is heat treated as discussed above. The heat-treated gasket may then be installed as discussed above in connection with FIG. 10.

While the preforming step is described above in connection with a right angle, it is within the scope of the invention to preform the gasket to any desired angle. Likewise, it is within the scope of the invention to preform the gasket to any curved shape that may be desired.

Figure 13:
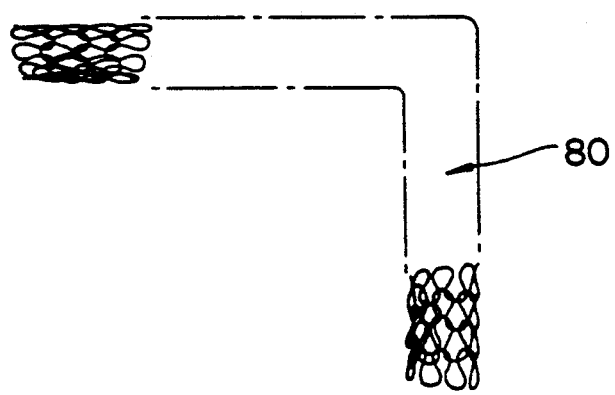
FIG. 13 is an elevation of a gasket pre-configured before heat treatment.

Furthermore, while FIG. 13 shows only one angular bend, it is contemplated that gaskets may be preformed with four right angle bends so as to define a complete, preformed, rectangular gasket. Other gasket shapes are also possible such as triangular, circular, oval, elliptical, polygonal, etc. Alternatively, a variety of preformed corner pieces can be fabricated so that any particular opening could be sealed by selecting appropriate corner pieces to be used in conjunction with straight pieces.

It should now be apparent that a new useful and unobvious heat-treated wire-mesh EMI/RFI shielding gasket has been described which overcomes problems of the type noted in connection with the prior art. It will also be apparent to those skilled in the art that numerous modifications, variations, substitutions, and equivalents exist for the heat-treated wire-mesh EMI/RFI shielding gasket described above. Accordingly, it is expressly intended that all such modifications, variations, substitutions, and equivalents for features of the invention as defined in the appended claims be embraced thereby.

What is claimed is:

1. A method of making a wire-mesh gasket structure comprising the steps of:
   selecting a heat-treatable wire in a soft temper condition;
   forming the heat-treatable wire into a tubular wire-mesh structure having a nominal dimension; and
   heat treating the tubular structure to a high temper condition whereby hardening occurs and forming stresses are relieved.

2. The method of claim 1 wherein the forming step includes knitting the tubular structure as a helical band of interengaging serpentine loops of wire.

3. The method of claim 2 wherein the knitting steps uses more than one wire simultaneously.

4. The method of claim 1 wherein the forming step includes braiding the tubular structure from a plurality of wires.

5. The method of claim 1 wherein the forming step is performed around a core.

6. The method of claim 5 wherein the core is an elastomeric material.

7. The method of claim 1 wherein the tubular shape is longitudinally creased.

8. The method of claim 1 wherein opposite sides of the tubular shape are pressed together and secured to one another so that a double-lobed shape results.

9. The method of claim 8 wherein each lobe has a core.

10. The method of claim 5 wherein the core is a wire-mesh gasket of smaller nominal diameter.

11. A method of making a wire-mesh gasket comprising the steps of
   selecting a wire in a pre-hardened condition;
   forming the pre-hardened wire into a tubular structure having a nominal dimension;
   heat treating the pre-hardened wire to a higher strength condition whereby forming stresses are relieved.

12. The method of claim 1 wherein the heat-treatment step is accomplished by heating the tubular structure to a temperature in the range of 550° to 900° F. for a time period in the rang of 0.10 to 24 hours.

13. The method of claim 1 wherein the heat-treatment step is accomplished by heating the tubular structure to a temperature in the range of 550° to 700° F. for a time period in the range of 0.25 to 24 hours.

14. The method of claim 1 wherein the heat-treatment step is accomplished by heating the tubular structure to a temperature in the range of 550° to 650° F. for a time period in the range of 2 to 3 hours.

15. The method of claim 1 including the step of forming the wire-mesh gasket structure into an installation configuration prior to the heat treatment step.

16. The method of claim 1 including the step of preforming the wire-mesh gasket structure to include at least one non-linear section prior to the heat-treatment step.

17. The method of claim 16 including the step of preforming a complete opening encircling wire-mesh gasket structure prior to the heat-treatment step.

* * * * *